US010810923B2

(12) United States Patent
Chen (10) Patent No.: US 10,810,923 B2
(45) Date of Patent: Oct. 20, 2020

(54) GOA CIRCUIT AND DISPLAY PANEL AND DISPLAY DEVICE INCLUDING THE SAME

(71) Applicant: SHENZHEN CHINA STAR OPTOELECTRONICS TECHNOLOGY CO., LTD., Shenzhen, Guangdong (CN)

(72) Inventor: Shuai Chen, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 149 days.

(21) Appl. No.: 16/321,970

(22) PCT Filed: Sep. 11, 2018

(86) PCT No.: PCT/CN2018/105019
§ 371 (c)(1),
(2) Date: Jan. 30, 2019

(87) PCT Pub. No.: WO2020/015091
PCT Pub. Date: Jan. 23, 2020

(65) Prior Publication Data
US 2020/0027383 A1 Jan. 23, 2020

(30) Foreign Application Priority Data

Jul. 18, 2018 (CN) .......................... 2018 1 0790896

(51) Int. Cl.
*G11C 19/00* (2006.01)
*G09G 3/20* (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 7,953,201 B2 * 5/2011 Tsai ........................ G11C 19/28
377/64
8,396,183 B2 * 3/2013 Yang ...................... G11C 19/28
377/64
(Continued)

FOREIGN PATENT DOCUMENTS

CN 104732939 A 6/2015
CN 105632441 A 6/2016
(Continued)

*Primary Examiner* — Tuan T Lam
(74) *Attorney, Agent, or Firm* — Maschoff Brennan (57) ABSTRACT

A GOA circuit is provided, the GOA circuit being a cascaded multiple-stages GOA circuit, each stage GOA circuit comprising a pull-up control unit, a pull-up unit, a signal downward transfer unit, a pull-down unit, one pull-down maintenance unit and a bootstrap unit, each stage GOA circuit being disposed with a clock signal input terminal, a first node, a first voltage input terminal, a pull-down signal input terminal and a scan signal output terminal to output a scan signal onto a horizontal scan line, the one pull-down maintenance unit comprising an inverter, the first node being disposed between an output terminal of the pull-up control unit and the bootstrap unit, when a potential of the first node is a high potential, a potential of a pull-down signal input to the pull-down signal input terminal is a low potential.

15 Claims, 4 Drawing Sheets

(51) Int. Cl.
  *G09G 3/36* (2006.01)
  *G11C 19/28* (2006.01)
(52) U.S. Cl.
  CPC ............... *G09G 2300/0408* (2013.01); *G09G 2300/0426* (2013.01); *G09G 2300/08* (2013.01); *G09G 2310/0202* (2013.01); *G09G 2310/0267* (2013.01); *G09G 2310/0286* (2013.01); *G09G 2310/06* (2013.01); *G09G 2310/08* (2013.01)

(56) References Cited

U.S. PATENT DOCUMENTS

| | | | |
|---|---|---|---|
| 10,140,913 B2 | 11/2018 | Chen | |
| 10,186,223 B2 | 1/2019 | Xu | |
| 2009/0304138 A1* | 12/2009 | Tsai | G11C 19/28 377/79 |
| 2016/0164514 A1* | 6/2016 | Xiao | H03K 17/687 327/109 |
| 2016/0275895 A1* | 9/2016 | Dai | G09G 3/36 |
| 2017/0039968 A1 | 2/2017 | Chen et al. | |
| 2017/0229084 A1* | 8/2017 | Wang | G09G 3/3696 |
| 2017/0270886 A1* | 9/2017 | Yu | G09G 3/20 |
| 2018/0061349 A1* | 3/2018 | Xu | G09G 3/3677 |
| 2018/0090087 A1 | 3/2018 | Shi | |
| 2018/0122318 A1* | 5/2018 | Cao | G09G 3/3648 |
| 2018/0218696 A1* | 8/2018 | Du | G09G 3/3659 |
| 2019/0019471 A1* | 1/2019 | Zeng | H01L 27/14689 |
| 2019/0103167 A1* | 4/2019 | Zeng | G09G 3/3677 |
| 2020/0043429 A1* | 2/2020 | Xu | G02F 1/13306 |

FOREIGN PATENT DOCUMENTS

| | | |
|---|---|---|
| CN | 205282053 U | 6/2016 |
| CN | 106023933 A | 10/2016 |
| CN | 106898290 A | 6/2017 |
| CN | 107610668 A | 1/2018 |
| KR | 10-2007-0095585 A | 10/2007 |

* cited by examiner

Prior Art

FIG.3

Prior Art

GOA CIRCUIT AND DISPLAY PANEL AND DISPLAY DEVICE INCLUDING THE SAME

TECHNICAL FIELD

The present invention relates to a display technical field, especially to a pull-down maintenance unit that may be applied to a GOA circuit.

BACKGROUND ART

With evolution of photoelectric and semiconductor technology, vigorous development is brought in a display panel field. In the current display field, ordinary and common displays are a liquid crystal display, an organic light emitting diode display and the like. In current active display panels, a chip on a display panel is driven using a drive signal from a drive circuit external to the display panel so as to display an image. Recently, in order to enable a frame of a display panel to become narrow, it has gradually developed into directly manufacturing a drive circuit on the display panel, for example, a Gate Drive on Array (GOA for short) is adopted to integrate a gate drive circuit on a substrate to perform a scan of the display panel.

The GOA technology, as compared with a conventional Chip on Film (COF) technology, not only may sharply save manufacture costs but also saves a bonding manufacture procedure of the COF at a gate side, which is extremely advantageous to improving product capacity, and also may make a display panel be more suitable for manufacturing a display product with a narrow frame or a frameless display product. Thus, the GOA technology is a key technology for future display panel development.

Figure 1:
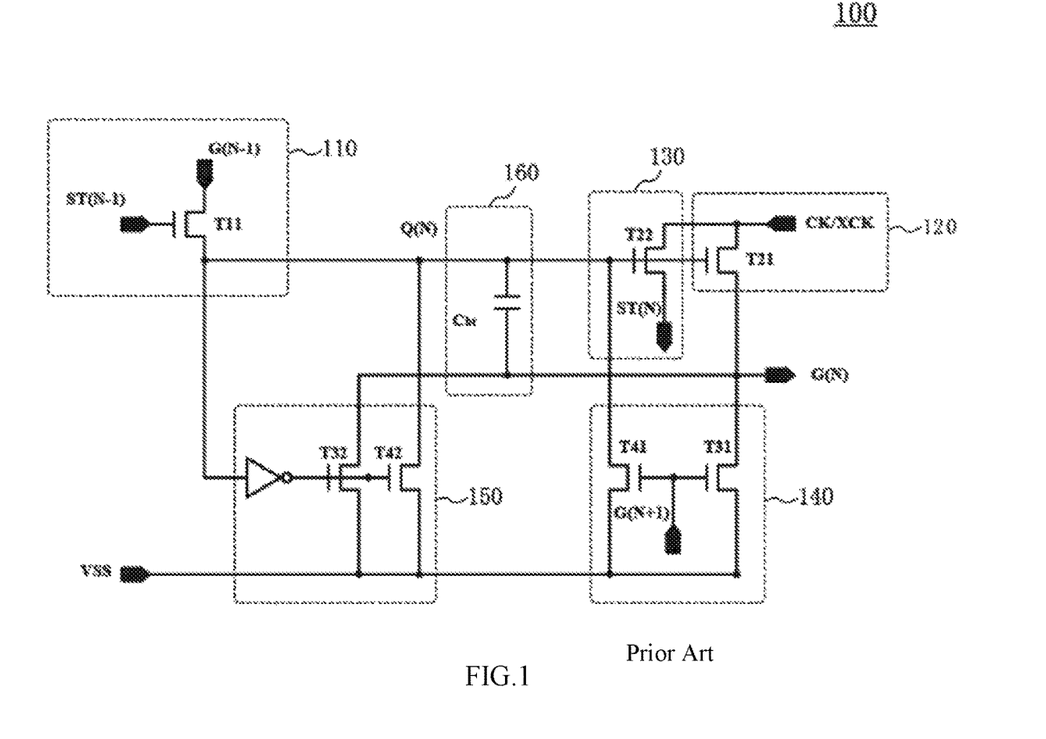
FIG. 1 illustrates an illustrative circuit diagram of a single-stage GOA circuit structure in the prior art.

FIG. 1 illustrates an illustrative circuit diagram of a single-stage GOA circuit in the prior art. The GOA circuit generally includes a plurality of single-stage GOA circuits that are cascaded, and each single-stage GOA circuit correspondingly drives a horizontal scan line at one level. As shown in FIG. 1, a single-stage GOA circuit 100 includes: a pull-up control unit 110, a pull-up unit 120, a signal downward transfer unit 130, a pull-down unit 140, a pull-down maintenance unit 150 and a bootstrap unit 160, wherein the pull-up control unit 110 is in charge of pre-charging a first node Q(N), the pull-up unit 120 mainly improves a potential of a scan signal output terminal G(N) to control turning on of a transistor of a pull-down unit of the upper-stage GOA circuit, the signal downward transistor unit 130 mainly controls transmission and cut-off of a scan signal in the pull-up control unit 110 of the next stage GOA circuit, the pull-down unit 140 is in charge of, at the first time, pulling down a potential of the first node Q(N) and a potential of the scan signal output terminal G(N) to a potential of a first voltage input terminal VSS, the pull-down maintenance unit 150 is in charge of maintaining a potential of the first node Q(N) and a potential of the scan signal output terminal G(N) at a potential of the first voltage input terminal VSS, and the bootstrap unit 160 is in charge of improving a potential of the first node Q(N), which is helpful for output of a potential of the scan signal output terminal G(N) of the pull-up unit 120. The potential of the first voltage input terminal VSS may be a low potential, for example, may be a ground voltage.

Figure 2:
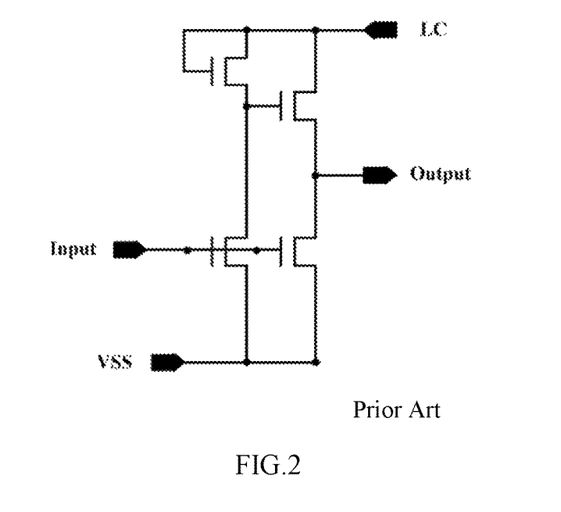
FIG. 2 illustrates an illustrative circuit diagram of a Darlington structure inverter in the prior art.

An electronic element in the pull-down maintenance unit 150 as illustrated in FIG. 1 is actually a Darlington structure inverter, of which the specific circuit is as illustrated in FIG. 2. FIG. 2 illustrates an illustrative circuit diagram of a Darlington structure inverter in the prior art. In the circuit diagram of the Darlington structure inverter, a low level signal is input at the first voltage input terminal VSS and a high level signal is input at a pull-down signal input terminal LC. When a high level signal is input at an inverter input terminal Input, an inverter output terminal Output outputs a low level signal. On the contrary, when a low level signal is input at an inverter input terminal Input, an inverter output terminal Output outputs a high level signal.

Figure 3:
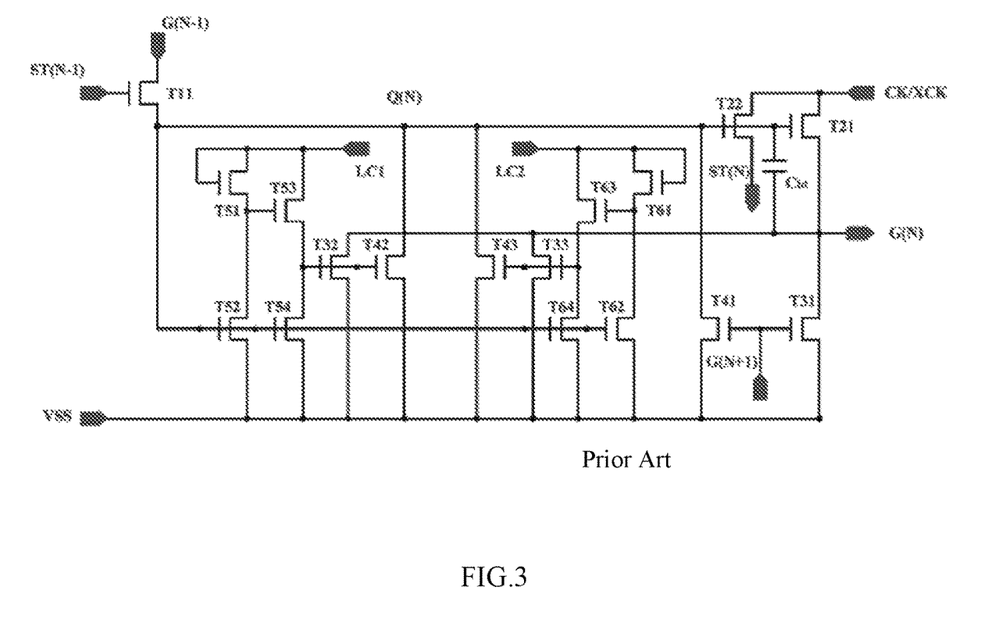
FIG. 3 illustrates another illustrative circuit diagram of a single-stage GOA circuit structure in the prior art.
Figure 4:
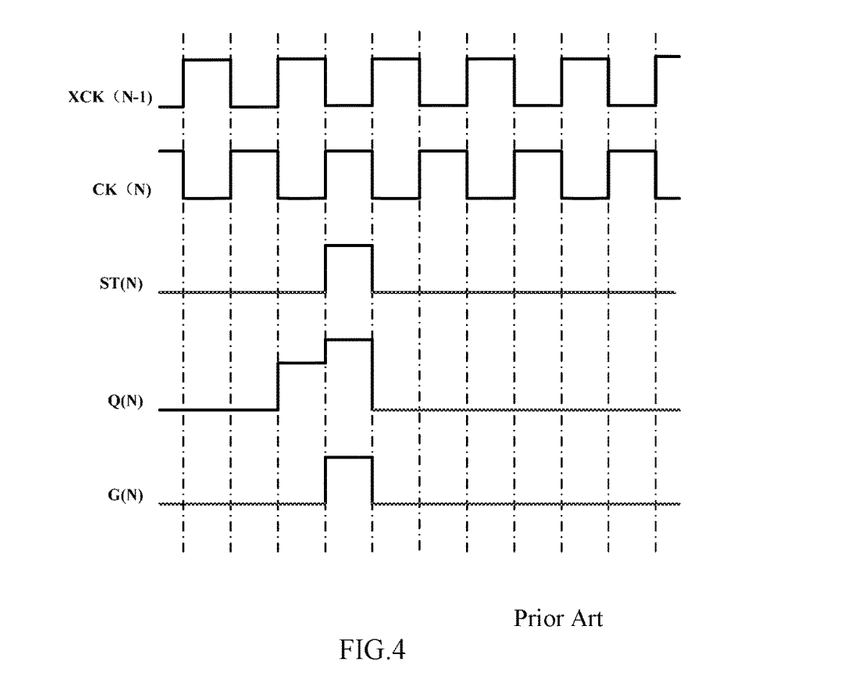
FIG. 4 is a timing diagram of respective signals in the single-stage GOA circuit structure as illustrated in FIG. 3.

In the GOA circuit structure in the prior art, the above portions are basically placed in a GOA circuit structure of a same stage, and in the prior art, in order to prevent severe positive bias of a pre-voltage value Vth of components caused by thin film transistors T32, T42 and T43 suffering a positive bias stress (PBS) for a long time, causing the circuit failure, two pull-down maintenance units are enabled to alternatively function in a GOA circuit of a same stage, hence, the single-stage GOA circuit structure in FIG. 1 may be transformed into the single-stage GOA circuit structure as illustrated in FIG. 3. FIG. 3 illustrates another illustrative circuit diagram of a single-stage GOA circuit structure in the prior art. In FIG. 3, two pull-down maintenance units are disposed to alternatively work. CK/XCK is a clock signal input terminal, ST(N) is a stage transfer signal output terminal, G(N) is a scan signal output terminal and Q(N) is a first node. FIG. 4 is a timing diagram of respective signals in the single-stage GOA circuit structure as illustrated in FIG. 3.

Figure 5:
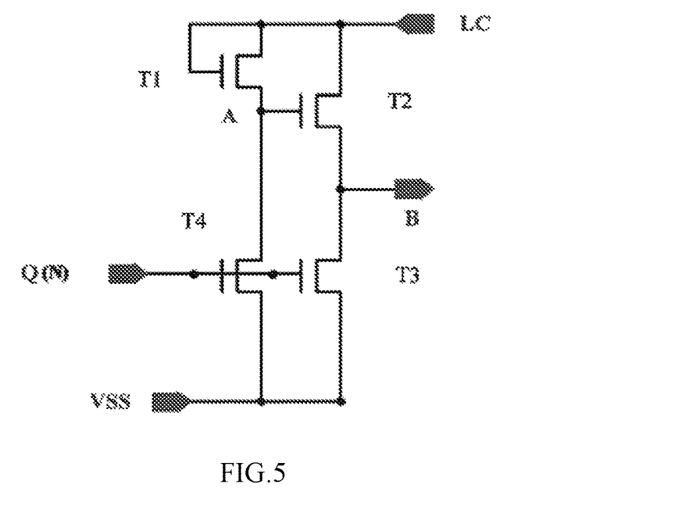
FIG. 5 illustrates an illustrative circuit diagram of an inverter applied to a GOA circuit structure.

A work principle of the inverter which has been applied to the GOA circuit in the prior art is further explained below. FIG. 5 illustrates an illustrative circuit diagram of an inverter applied to a GOA circuit structure. In FIG. 5, a high level signal may be input at the pull-down signal input terminal LC, a low level signal may be input at the first voltage input terminal VSS, and the potential of the first node Q(N) may be an Alternating Current (AC) potential. As illustrated in FIG. 5, when a potential of the first node Q(N) is a low potential, a fourth transistor T4 and a third transistor T3 are turned off, and a first transistor T1 is turned on, thus, a potential of A point is a high potential, thereby a second transistor T2 is turned on, and a potential of B point is a high potential. When the potential of the first node Q(N) is a high potential, the fourth transistor T4 is turned on, and the first transistor T1 is turned on, at this point, the potential of A point is mutually pulled by a high potential of the pull-down signal input terminal LC and a low potential of the first voltage input terminal VSS so as to be at a certain intermediate potential, the second transistor T2 is in a semi-conducting state, and the third transistor T3 is in a turned-on state. Thus, the potential of B point is also mutually pulled by the potential of the pull-down signal input terminal LC and the potential of the first voltage input terminal VSS so as not to satisfy the requirement of an absolute low potential.

SUMMARY

Exemplary embodiments of the present invention is to provide a GOA circuit structure, in which only one pull-down maintenance unit is disposed. Based on the GOA circuit structure, the exemplary embodiments of the present invention provide a new LC control signal which may effectively avoid that an output terminal cannot satisfy the requirement of an absolute low potential when an inverter in the GOA circuit structure has a high potential at an input terminal, thereby improving reliability and stability of the GOA circuit structure.

According to an exemplary embodiment of the present invention, a GOA circuit is provided, the GOA circuit being a cascaded multiple-stage GOA circuit, each stage GOA circuit comprising a pull-up control unit, a pull-up unit, a signal downward transfer unit, a pull-down unit, one pull-down maintenance unit and a bootstrap unit, each stage GOA circuit being disposed with a clock signal input terminal, a first node, a first voltage input terminal, a pull-down signal input terminal and a scan signal output terminal to output a scan signal onto a horizontal scan line, the one pull-down maintenance unit comprising an inverter. The inverter comprises first to fourth inverse transistors, a source electrode and a gate electrode of the first inverse transistor and a source electrode of the third inverse transistor are connected to the pull-down signal input terminal, a gate electrode of the third inverse transistor is connected to a drain electrode of the first inverse transistor, a gate electrode of the second inverse transistor and a gate electrode of the fourth inverse transistor are connected to the first node, a source electrode of the second inverse transistor and a source electrode of the fourth inverse transistor are respectively connected to the drain electrode of the first inverse transistor and a drain electrode of the third inverse transistor, and a drain electrode of the second inverse transistor and a drain electrode of the fourth inverse transistor are connected to the first voltage input terminal. The first node is disposed between an output terminal of the pull-up control unit and the bootstrap unit. When a potential of the first node is a high potential, a potential of a pull-down signal input to the pull-down signal input terminal is a low potential, and the time when the pull-down signal is at a high potential and the time when the pull-down signal is at a low potential during one period of the pull-down signal are both equal to the time when a signal at the first node is at a high potential.

According to an exemplary embodiment of the present invention, the pull-up control unit is connected to the signal downward transfer unit through the first node.

According to an exemplary embodiment of the present invention, the pull-down maintenance unit further comprises a first pull-down maintenance transistor and a second pull-down maintenance transistor, a gate electrode of the first pull-down maintenance transistor and a gate electrode of the second pull-down maintenance transistor are connected to the source electrode of the fourth inverse transistor, a source electrode of the first pull-down maintenance transistor and a source electrode of the second pull-down maintenance transistor are respectively connected to the scan signal output terminal and the first node, and a drain electrode of the first pull-down maintenance transistor and a drain electrode of the second pull-down maintenance transistor are connected to the first voltage input terminal.

According to an exemplary embodiment of the present invention, the pull-down signal is a clock signal.

According to an exemplary embodiment of the present invention, in the GOA circuit, four pull-down signal lines for providing signals for the pull-down signal input terminal are disposed, and the pull-down signals provided by the four pull-down signal lines are clock signals which have the same waveform and are sequentially different by a quarter period.

According to an exemplary embodiment of the present invention, the time when the pull-down signal is at a high potential and the time when the pull-down signal is at a low potential during one period of the pull-down signal are both equal to twice as much as the time when the clock signal input to the clock signal input terminal is at a high potential during one period of the clock signal.

According to an exemplary embodiment of the present invention, a low potential of the pull-down signal is less than or equal to a potential of the first voltage input terminal.

According to an exemplary embodiment of the present invention, a display panel having the above mentioned GOA circuit is provided.

According to an exemplary embodiment of the present invention, a display device having the above mentioned display panel is provided.

Other aspects and/or advantages of an overall concept of the present invention will be partially illustrated in the following description, and the rests will be clarified through description, or can be learned by implementation of an overall concept of the present invention.

BRIEF DESCRIPTION OF THE DRAWINGS

The drawings are included to provide further comprehension of the present invention. The drawings are incorporated into the present description and formed as a portion of the present description. The drawings illustrate the embodiments of the present invention with examples and are used for explaining the principle of the present invention along with descriptions.

DETAILED DESCRIPTION OF EXEMPLARY EMBODIMENTS

The present invention is more sufficiently described with reference to the accompany drawings below, and embodiments of the present invention are illustrated in the drawings. However, the present invention may be implemented in many different forms, rather than being construed as being limited to these embodiments described herein, these embodiments are provided so that the present disclosure is made thorough, and the scope of the present invention is sufficiently conveyed to those skilled in the art. One or more equivalent arrangements may be used to implement respective exemplary embodiments. In addition, the same reference sign indicates the same element.

Although various elements, components, areas, layers and/or parts may be described by using terms such as "first", "second" and the like, these elements, components, areas, layers and/or parts should not be limited by these terms. These terms are used for distinguishing one element, component, area, layer and/or part from another element, component, area, layer and/or part. Thus, in the case of not deviating from a teaching of the present invention, a first element, a first component, a first area, a first layer and/or a first part, discussed below, may be named as a second element, a second component, a second area, a second layer and/or a second part.

Unless otherwise defined, all of terms (including technical terms and scientific terms) used here have the same meanings as the meanings generally comprehended by those ordinary skilled in the art. Unless so clearly defined here, terms (such as the terms defined in a general dictionary) should be construed to have the meanings consistent with their meanings in a context of a related field, rather than being construed with idealized or over-formalized meanings.

In addition, the transistor in the present application may be a thin film transistor, which includes a gate electrode, a source electrode and a drain electrode. In following embodiments, an N type transistor is taken as an example for description. However, the present invention is not limited to this. In other embodiments, the transistor in the present application may also be a P type transistor, and when the transistor is a P type transistor, a timing diagram concerning signals may be correspondingly amended. In addition, a source electrode and a drain electrode of the transistor in the present application may be exchangeable.

Exemplary embodiments of the invention will be described in detail hereinafter with reference to the accompanying drawings.

Figure 6:
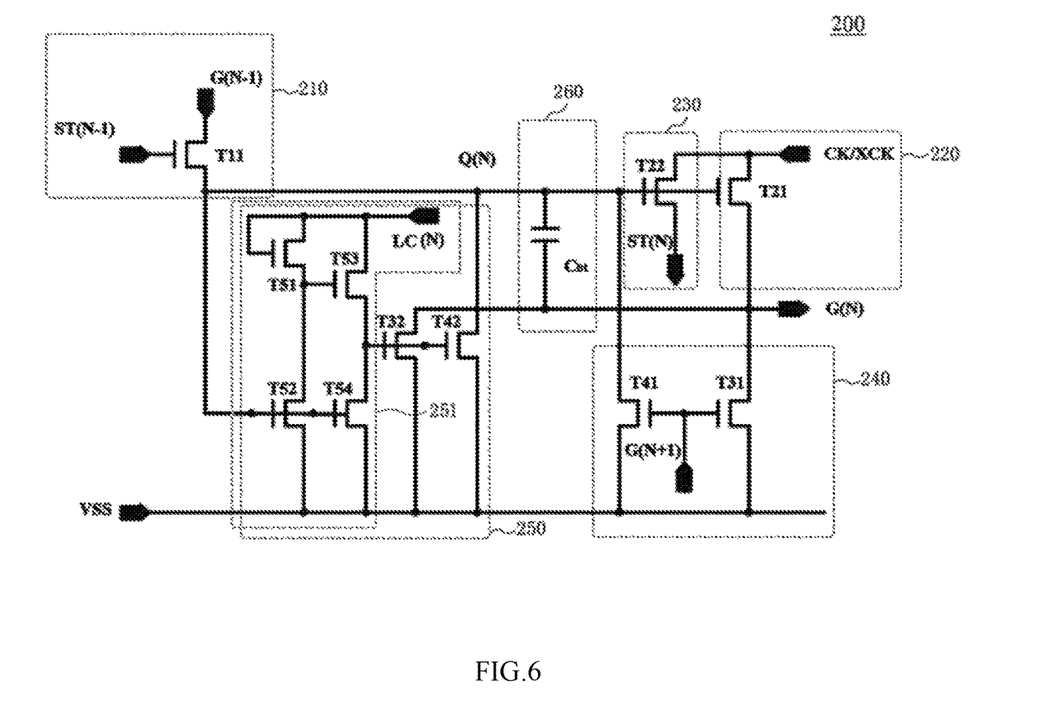
FIG. 6 illustrates an illustrative circuit diagram of a single-stage GOA circuit structure of an exemplary embodiment of the present invention.

FIG. 6 illustrates an illustrative circuit diagram of a single-stage GOA circuit structure 200 of an exemplary embodiment of the present invention. A GOA circuit is provided in the exemplary embodiment of the present invention, which is formed by cascading multiple single-stage GOA circuit structures 200. In the following description, the Nth-stage GOA circuit structure is taken as an example, wherein N is an integer larger than 0. In the single-stage GOA circuit structure 200 as said in FIG. 6, a pull-up control unit 210, a pull-up unit 220, a signal downward transfer unit 230, a pull-down unit 240, a pull-down maintenance unit 250 and a bootstrap unit 260 are included.

The pull-up control unit 210 may include a pull-up control transistor T11, wherein a gate electrode of the pull-up control transistor T11 may be connected to an upper-stage stage transfer signal output terminal ST(N−1), a source electrode of the pull-up control transistor T11 may be connected to an upper-stage scan signal output terminal G(N−1), and a drain electrode of the pull-up control transistor T11 may be connected to a first node Q(N). Thus, the pull-up control transistor T11 may be turned on under a control of an upper-stage stage transfer signal, so as to an upper-stage scan signal is transmitted to the first node Q(N) to accomplish a pre-charging of the first node Q(N).

The pull-up unit 220 may include a pull-up transistor T21. A gate electrode of the pull-up transistor T21 may be connected to the first node Q(N), a source electrode of the pull-up transistor T21 may be connected to a clock signal input terminal CK/XCK, and a drain electrode of the pull-up transistor T21 may be connected to a scan signal output terminal G(N). On the other hand, the drain electrode of the pull-up transistor T21 may be connected to a source electrode of a pull-up control transistor T11 of a lower-stage pull-up control unit 210. Thus, the pull-up transistor T21 may be turned on under a control of the first node Q(N), thereby outputting a clock signal to the scan signal output terminal G(N) to improve a potential of the scan signal.

The signal downward transfer unit 230 may output a stage transfer signal through the input clock signal under a control of a potential of the first node Q(N), thereby controlling turn-on and turn-off of the lower-stage pull-up control transistor T11. The signal downward transfer unit 230 may include a signal downward transfer transistor T22. A gate electrode of the signal downward transfer transistor T22 may be connected to the first node Q(N), a source electrode of the signal downward transfer transistor T22 may be connected to the clock signal input terminal CK/XCK, and a drain electrode of the signal downward transfer transistor T22 may be connected to the stage transfer signal output terminal ST(N). Thus, the signal downward transfer transistor T22 may be turned on under a control of a signal of the first node Q(N) to output the clock signal as the stage transfer signal.

The pull-down unit 240 may pull down the potential of the first node Q(N) and the scan signal output terminal G(N) to a first voltage under a control of a lower-stage scan signal and maintain the voltage of the first node Q(N) and the scan signal at the first voltage. The pull-down unit 240 may include a first pull-down transistor T31 and a second pull-down transistor T41. A gate electrode of the first pull-down transistor T31 may be connected to a lower-stage scan signal output terminal G(N+1), and a source electrode and a drain electrode of the first pull-down transistor T31 may be connected to the scan signal output terminal G(N) and the first voltage input terminal VSS, respectively. A gate electrode of the second pull-down transistor T41 may also be connected to the lower-stage scan signal output terminal G(N+1), and a source electrode and a drain electrode of the second pull-down transistor T41 may be connected to the first node Q(N) and the first voltage input terminal VSS, respectively. Thus, the first pull-down transistor T31 and the second pull-down transistor T41 may be turned on under a control of a lower-stage scan signal, thereby pulling down the potential of the first node Q(N) to a first voltage and maintaining the present stage scan signal at the first voltage. The potential of the first voltage input terminal VSS may be a low potential, for example, may be a ground voltage.

The pull-down maintenance unit 250 may include an inverter unit 251, a first pull-down maintenance transistor T32 and a second pull-down maintenance transistor T42. The inverter unit 251 may be disposed between the voltage input terminal VSS and the pull-down signal input terminal LC(N). An input terminal of the inverter unit 251 may be connected to the first node Q(N), and may be connected to a drain electrode of the pull-up control transistor T11 of the pull-up control unit 210. In other words, the input terminal of the inverter unit 251 may be disposed between a drain electrode of the pull-up control transistor T11 and the first node Q(N). An output terminal of the inverter unit 251 is connected to a gate electrode of the first pull-down maintenance transistor T32 and a gate electrode of the second pull-down maintenance transistor T42. An input high level signal can be converted into a low level signal by the inverter unit 251 to be output to the gate electrode of the first pull-down maintenance transistor T32 and the gate electrode of the second pull-down maintenance transistor T42, or an input low level signal can be converted into a high level signal by the inverter unit 251 to be output to the gate electrode of the first pull-down maintenance transistor T32 and the gate electrode of the second pull-down maintenance transistor T42. A source electrode of the first pull-down maintenance transistor T32 may be connected to the scan signal output terminal G(N), and a drain electrode of the first pull-down maintenance transistor T32 may be connected to the first voltage input terminal VSS. A source electrode and a drain electrode of the second pull-down maintenance transistor T42 may be connected to the first node Q(N) and the first voltage input terminal VSS, respectively. The first pull-down maintenance transistor T32 and the second pull-down maintenance transistor T42 may be turned on under a control of an output signal of the inverter, thereby maintaining the voltage of the first node Q(N) and the scan signal output terminal G(N) at the first voltage.

The inverter unit 251 may be a Darlington inverter, which may include four transistors, that is, first to fourth inverse transistors T51, T52, T53 and T54. A gate electrode of the first inverse transistor T51 may be connected to a pull-down signal input terminal LC(N), and may be connected to a source electrode of the first inverse transistor T51, that is, the first inverse transistor T51 may be in diode connection. A drain electrode of the first inverse transistor T51 may be connected to a gate electrode of the third inverse transistor T53 and a source electrode of the second inverse transistor T52. A gate electrode of the second inverse transistor T52 may be connected to the first node Q(N), and a source electrode and a drain electrode of the second inverse transistor T52 may be connected to the drain electrode of the first inverse transistor T51 and the first voltage input terminal VSS, respectively. The gate electrode of the third inverse transistor T53 may be connected to the drain electrode of the first inverse transistor T51, and a source electrode and a drain electrode of the third inverse transistor T53 may be connected to the pull-down signal input terminal LC(N) and a drain electrode of the fourth inverse transistor T54. A gate electrode of the fourth inverse transistor T54 may be connected to the first node Q(N), and a source electrode and the drain electrode of the fourth inverse transistor T54 may be connected to the drain electrode of the third inverse transistor T53 and the first voltage input terminal VSS, respectively.

The gate electrode of the first pull-down maintenance transistor T32 and the gate electrode of the second pull-down maintenance transistor T42 may be connected between the third inverse transistor T53 and the fourth inverse transistor T54, that is, the gate electrode of the first pull-down maintenance transistor T32 and the gate electrode of the second pull-down maintenance transistor T42 may be connected to the source electrode of the fourth inverse transistor T54.

The bootstrap unit 260, which may include a bootstrap capacitor Cbt, may be coupled between the first node Q(N) and the scan signal output terminal G(N), and may improve and maintain the potential of the first node Q(N). Both terminals of the bootstrap capacitor Cbt are connected to the first node Q(N) and the scan signal output terminal G(N), respectively.

Figure 7:
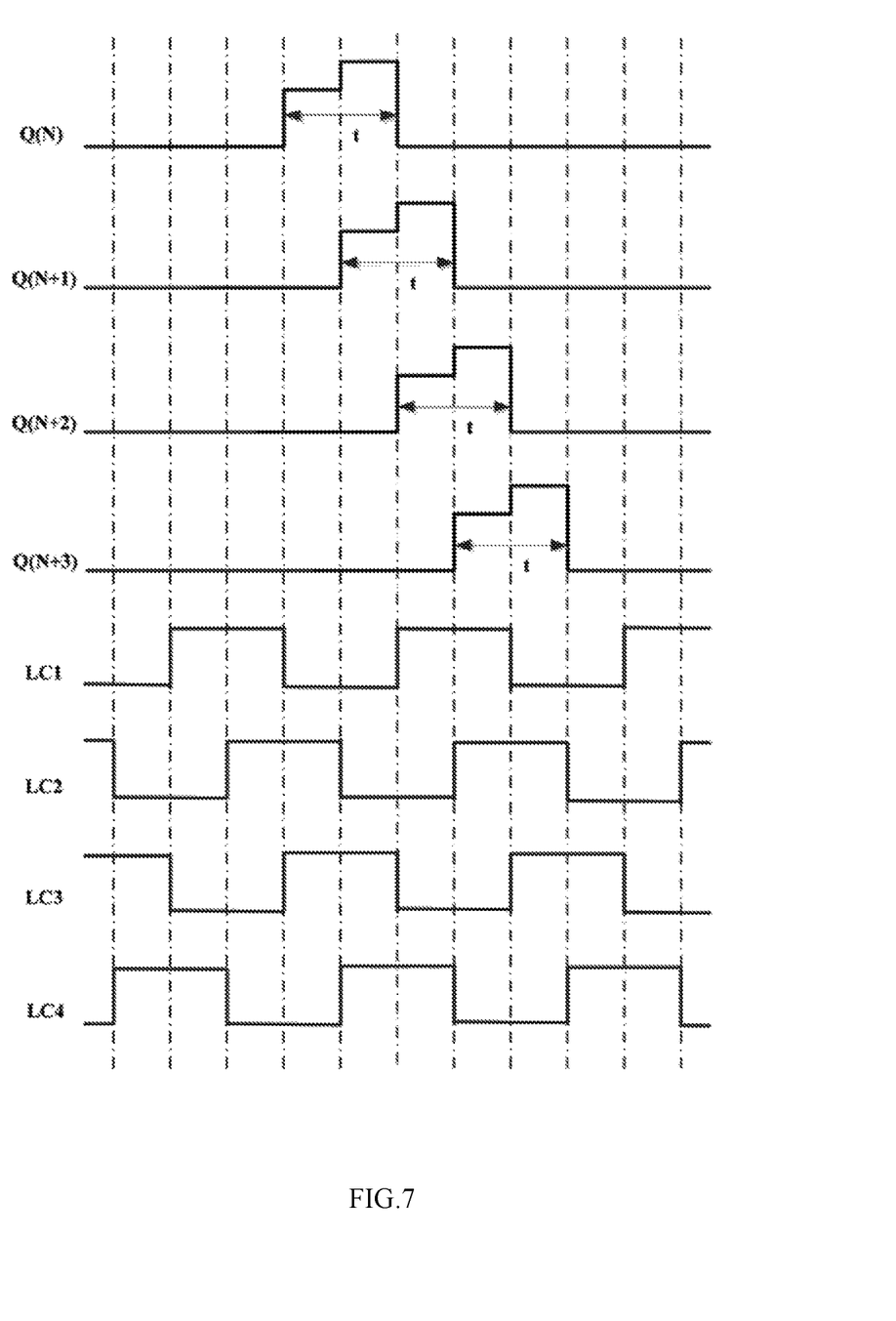
FIG. 7 illustrates a timing diagram of pull-down signals and signals at a first node of the GOA circuit structure of an exemplary embodiment of the present invention.

Below the inverter unit 251 is further described in detail with reference to the contents illustrated in FIGS. 6 and 7. FIG. 7 illustrates a timing diagram of pull-down signals and signals at a first node of the GOA circuit structure of an exemplary embodiment of the present invention.

As illustrated in FIG. 7, in the exemplary embodiment of the present invention, the pull-down signal input terminal LC(N) may be input with the pull-down signal similar to a clock signal. In the entire GOA circuit structure of the present invention, the pull-down signal input terminal LC(N) may be disposed with four pull-down signal lines LC1, LC2, LC3 and LC4. In one period of the pull-down signal, the time when the pull-down signal is at a high potential and the time when the pull-down signal at a low potential are both the time t when the signal at the first node Q(N) is at a high potential, that is, the time when the pull-down signal is at a high potential and the time when the pull-down signal at a low potential are both twice as much as the time when the clock signal input to the clock signal input terminal CK/XCK is at a high potential.

Supposing that a pull-down signal corresponding to the Nth stage GOA circuit structure is LC1, a pull-down signal corresponding to the N+1th stage GOA circuit structure is LC2, the pull-down signal corresponding to the N+2th stage GOA circuit structure is LC3, and the pull-down signal corresponding to the N+3th stage GOA circuit structure is LC4. In a similar fashion, a pull-down signal corresponding to the N+4th stage GOA circuit structure is LC1, a pull-down signal corresponding to the N+5th stage GOA circuit structure is LC2, and so on.

Here, the Nth stage GOA circuit structure is taken as an example to explain the operation of the inverter unit 251, when the first node Q(N) is at a high potential and the pull-down signal LC1 is at a low potential, the first inverse transistor T51 and the third inverse transistor T53 are turned off, the second inverse transistor T52 and the fourth inverse transistor T54 are turned on, and the first pull-down maintenance transistor T32 and the second pull-down maintenance transistor T42 are turned off. Since the pull-down signal LC1 at this point is not a high potential any more, the mutually pulling between the first voltage and the pull-down signal LC1 does not exist.

When the first node Q(N) is at a low potential and the pull-down signal LC1 is at a high potential, the first inverse transistor T51 and the third inverse transistor T53 are turned on, the second inverse transistor T52 and the fourth inverse transistor T54 are turned off, and the first pull-down maintenance transistor T32 and the second pull-down maintenance transistor T42 are turned on. The pull-down maintenance unit 250 normally works.

When the first node Q(N) is at a low potential and the pull-down signal LC1 is likewise at a low potential, first to fourth inverse transistors T51, T52, T53 and T54 are all turned off, and the pull-down maintenance unit 250 does not work.

It may be seen based on the work principle of the inverter unit 251 that in order to make the inverter unit 251 better produce an effect, when the potential of the first node Q(N) is a high potential, the potential of the pull-down signal LC1 is a low potential. When the potential of the pull-down signal LC1 is a high potential, the potential of the first node Q(N) is a low potential. In addition, in one period of the pull-down signal, the time when the pull-down signal is at a high potential and the time when the pull-down signal is at a low potential are both the time t when the potential at the first node Q(N) is at a high potential.

In the exemplary embodiment of the present invention, the pull-down signals LC1, LC2, LC3 and LC4 may be selected to be clock signals which have the same waveform and are sequentially different by a quarter period.

In addition, in order to enable the first inverse maintenance transistor T32 and the second inverse maintenance transistor T42 to be better turned off, the low potential of the pull-down signal shall be less than or equal to the potential of the first voltage input terminal VSS. Since conversion between a high potential and a low potential has appeared in the potential of the pull-down signal input terminal LC(N), the first inverse maintenance transistor T32 and the second inverse maintenance transistor T42 are subject to two functions of a Positive Bias Stress and a Negative Bias Stress (NBS) so that the problem on invalidity of a thin film transistor component caused due to being subject to a single pressure is improved.

In the prior art, the potential input at the pull-down signal input terminal LC is a high potential, however, in the exemplary embodiment of the present invention, the signal input at the pull-down signal input terminal LC(N) is a cyclical clock signal, and conversion between a high potential and a low potential has appeared in the signal input at the pull-down signal input terminal LC(N). In the exemplary embodiment of the present invention, when the potential of the first node Q(N) is a high potential, the potential of the pull-down signal LC1 is a low potential, and in one period of the pull-down signal, the time when the pull-down signal is at a high potential and the time when the pull-down signal is at a low potential are both the time t when the potential at the first node Q(N) is at a high potential. Thus, in the exemplary embodiment of the present invention, the output terminal not satisfying the requirement for an absolute low potential when the inverter unit has a high potential at the input terminal can be prevented, thereby improving reliability and stability of the GOA circuit structure.

In addition, since only one pull-down maintenance unit is disposed in the single-stage GOA circuit structure of the present application, the circuit structure is simplified while satisfying the circuit function, thereby facilitating a narrow frame design of a display panel.

According to an exemplary embodiment of the present invention, the present invention may provide a display panel, which includes a display area and a GOA circuit on an edge of the display area, wherein the GOA circuit is similar to the GOA circuit structure and principle in the above embodiments, and no more details are given here.

According to an exemplary embodiment of the present invention, the present invention may further provide a display device, which may include the display panel in the above embodiments.

In conclusion, the present invention provides a simplified GOA circuit, in which an pull-down signal having conversion of a high potential and a low potential may be applied, the output terminal not satisfying the requirement for an absolute low potential when the inverter unit has a high potential at the input terminal can be effectively prevented, thereby improving reliability and stability of the GOA circuit structure.

Although some exemplary embodiments of the present invention have been shown and described, it will be understood by those skilled in the art that the amendments can be made to those embodiments without departing from the principle and spirit of the present invention of which the scope is defined by the claims and the equivalents thereof.

What is claimed is:

1. A GOA circuit, the GOA circuit being a cascaded multiple-stages GOA circuit, each stage GOA circuit comprising a pull-up control unit, a pull-up unit, a signal downward transfer unit, a pull-down unit, one pull-down maintenance unit and a bootstrap unit, each stage GOA circuit being disposed with a clock signal input terminal, a first node, a first voltage input terminal, a pull-down signal input terminal, and a scan signal output terminal to output a scan signal onto a horizontal scan line, and the one pull-down maintenance unit comprising an inverter, wherein the inverter comprises first to fourth inverse transistors, a source electrode and a gate electrode of the first inverse transistor and a source electrode of the third inverse transistor are connected to the pull-down signal input terminal, a gate electrode of the third inverse transistor is connected to a drain electrode of the first inverse transistor, a gate electrode of the second inverse transistor and a gate electrode of the fourth inverse transistor are connected to the first node, a source electrode of the second inverse transistor and a source electrode of the fourth inverse transistor are respectively connected to the drain electrode of the first inverse transistor and a drain electrode of the third inverse transistor, and the second inverse transistor and a drain electrode of the fourth inverse transistor are connected to the first voltage input terminal, wherein the first node is disposed between an output terminal of the pull-up control unit and the bootstrap unit, and wherein when a potential of the first node is a high potential, a potential of a pull-down signal input to the pull-down signal input terminal is a low potential, and the time when the pull-down signal is at a high potential and the time when the pull-down signal is at a low potential during one period of the pull-down signal are both equal to the time when a signal at the first node is at a high potential.

2. The GOA circuit of claim 1, wherein the pull-up control unit is connected to the signal downward transfer unit through the first node.

3. The GOA circuit of claim 1, wherein the pull-down maintenance unit further comprises a first pull-down maintenance transistor and a second pull-down maintenance transistor, a gate electrode of the first pull-down maintenance transistor and a gate electrode of the second pull-down maintenance transistor are connected to the source electrode of the fourth inverse transistor, a source electrode of the first pull-down maintenance transistor and a source electrode of the second pull-down maintenance transistor are respectively connected to the scan signal output terminal and the first node, and a drain electrode of the first pull-down maintenance transistor and a drain electrode of the second pull-down maintenance transistor are connected to the first voltage input terminal.

4. The GOA circuit of claim 1, wherein the pull-down signal is a clock signal.

5. The GOA circuit of claim 4, wherein in the GOA circuit, four pull-down signal lines for providing signals for the pull-down signal input terminal are disposed, and the pull-down signals provided by the four pull-down signal lines are clock signals which have the same waveform and are sequentially different by a quarter period.

6. The GOA circuit of claim 1, wherein the time when the pull-down signal is at a high potential and the time when the pull-down signal is at a low potential during one period of the pull-down signal are both equal to twice as much as the time when the clock signal input to the clock signal input terminal is at a high potential during one period of the clock signal.

7. The GOA circuit of claim 1, wherein a low potential of the pull-down signal is less than or equal to a potential of the first voltage input terminal.

8. A display panel, which comprises a GOA circuit, wherein the GOA circuit is a cascaded multiple-stages GOA circuit, each stage GOA circuit comprises a pull-up control unit, a pull-up unit, a signal downward transfer unit, a pull-down unit, one pull-down maintenance unit and a bootstrap unit, each stage GOA circuit is disposed with a clock signal input terminal, a first node, a first voltage input terminal, a pull-down signal input terminal, and a scan signal output terminal to output a scan signal onto a horizontal scan line, and the one pull-down maintenance unit comprises an inverter, wherein the inverter comprises first to fourth inverse transistors, a source electrode and a gate electrode of the first inverse transistor and a source electrode of the third inverse transistor are connected to the pull-down signal input terminal, a gate electrode of the third inverse transistor is connected to a drain electrode of the first inverse transistor, a gate electrode of the second inverse transistor and a gate electrode of the fourth inverse transistor are connected to the first node, a source electrode of the second inverse transistor and a source electrode of the fourth inverse transistor are respectively connected to the drain electrode of the first inverse transistor and a drain electrode of the third inverse transistor, and a drain electrode of the second inverse transistor and a drain electrode of the fourth inverse transistor are connected to the first voltage input terminal, wherein the first node is disposed between an output terminal of the pull-up control unit and the bootstrap unit, and wherein when a potential of the first node is a high potential, a potential of a pull-down signal input to the pull-down signal input terminal is a low potential, and the time when the pull-down signal is at a high potential and the time when the pull-down signal is at a low potential during one period of the pull-down signal are both equal to the time when a signal at the first node is at a high potential.

9. The display panel of claim 8, wherein the pull-up control unit is connected to the signal downward transfer unit through the first node.

10. The display panel of claim 8, wherein the pull-down maintenance unit further comprises a first pull-down maintenance transistor and a second pull-down maintenance transistor, a gate electrode of the first pull-down maintenance transistor and a gate electrode of the second pull-down maintenance transistor are connected to the source electrode of the fourth inverse transistor, a source electrode of the first pull-down maintenance transistor and a source electrode of the second pull-down maintenance transistor are respectively connected to the scan signal output terminal and the first node, and a drain electrode of the first pull-down maintenance transistor and a drain electrode of the second pull-down maintenance transistor are connected to the first voltage input terminal.

11. The display panel of claim 8, wherein the pull-down signal is a clock signal.

12. The display panel of claim 11, wherein in the GOA circuit, four pull-down signal lines for providing signals for the pull-down signal input terminal are disposed, and the pull-down signals provided by the four pull-down signal lines are clock signals which have the same waveform and are sequentially different by a quarter period.

13. The display panel of claim 8, wherein the time when the pull-down signal is at a high potential and the time when the pull-down signal is at a low potential during one period of the pull-down signal are both equal to twice as much as the time when the clock signal input to the clock signal input terminal is at a high potential during one period of the clock signal.

14. The display panel of claim 8, wherein a low potential of the pull-down signal is less than or equal to a potential of the first voltage input terminal.

15. A display device, which comprises the display panel of claim 8.

* * * * *